United States Patent
Chien et al.

(12) 
(10) Patent No.: US 10,312,276 B2
(45) Date of Patent: Jun. 4, 2019

(54) IMAGE SENSOR PACKAGE TO LIMIT PACKAGE HEIGHT AND REDUCE EDGE FLARE

(71) Applicant: OmniVision Technologies, Inc., Santa Clara, CA (US)

(72) Inventors: Wei-Chih Chien, Zhubei (TW); Wei-Feng Lin, Zhudong Township, Hsinchu County (TW)

(73) Assignee: OmniVision Technologies, Inc., Santa Clara, CA (US)

(*) Notice: Subject to any disclaimer, the term of this patent is extended or adjusted under 35 U.S.C. 154(b) by 2 days.

(21) Appl. No.: 15/666,901

(22) Filed: Aug. 2, 2017

(65) Prior Publication Data
US 2019/0043904 A1 Feb. 7, 2019

(51) Int. Cl.
*H01L 27/146* (2006.01)
*H01L 23/48* (2006.01)
*H01L 23/00* (2006.01)

(52) U.S. Cl.
CPC ...... *H01L 27/14618* (2013.01); *H01L 23/481* (2013.01); *H01L 24/16* (2013.01); *H01L 24/73* (2013.01); *H01L 27/14623* (2013.01); *H01L 27/14636* (2013.01); *H01L 2224/13144* (2013.01); *H01L 2224/16227* (2013.01); *H01L 2224/73204* (2013.01)

(58) Field of Classification Search
CPC . H01L 27/14618; H01L 23/481; H01L 24/16; H01L 24/73; H01L 27/14623; H01L 27/14636; H01L 2224/13144; H01L 2224/16227; H01L 2224/73204
See application file for complete search history.

(56) References Cited

U.S. PATENT DOCUMENTS

| | | | | |
|---|---|---|---|---|
| 2006/0231750 A1* | 10/2006 | Chao | ............... | H01L 27/14618 250/239 |
| 2008/0197435 A1* | 8/2008 | Yang | ............... | H01L 27/14618 257/432 |
| 2009/0284628 A1* | 11/2009 | Wu | ................ | H01L 27/14618 348/294 |
| 2012/0273908 A1* | 11/2012 | Kinsman | ........... | H01L 27/14618 257/432 |
| 2015/0256725 A1* | 9/2015 | Jiang | .................. | H04N 5/2253 348/373 |
| 2015/0287659 A1* | 10/2015 | Liu | ..................... | H01L 23/3114 257/737 |
| 2017/0140202 A1* | 5/2017 | Huang | .............. | G06K 9/00053 |
| 2017/0293115 A1* | 10/2017 | Chen | ................. | G02B 13/0085 |

* cited by examiner

*Primary Examiner* — Fernando L Toledo
*Assistant Examiner* — Neil R Prasad

(57) ABSTRACT

An image sensor package, comprising a silicon substrate; an image sensor pixel array that is formed on the silicon substrate; a peripheral circuit region that is formed around the image sensor pixel array on the silicon substrate; a redistribution layer (RDL) that is electrically coupled to the peripheral circuit region; at least one solder ball that is electrically coupled to the RDL; and a cover glass that is coupled to the RDL. No part of the RDL is located directly above or below the image sensor pixel array. No part of the at least one solder ball is located directly above or below the silicon substrate. A dark material layer is implemented to prevent an edge flare effect of the image sensor pixel array.

16 Claims, 7 Drawing Sheets

IMAGE SENSOR PACKAGE TO LIMIT PACKAGE HEIGHT AND REDUCE EDGE FLARE

TECHNICAL FIELD

This disclosure relates generally to image sensor packaging. In particular, an image sensor is packaged to have its redistribution layer (RDL) and solder balls located to the sides of its pixel array, in order to reduce the overall height of the image sensor package. In addition, a dark material sidewall is implemented to reduce undesirable edge flare.

BACKGROUND INFORMATION

An image sensor uses opto-electronic components, such as photodiodes, to detect incoming light and produce electronic signals in response. A primary component of the image sensor is its sensor pixel array, wherein each pixel includes a photodiode to convert photons to charge carriers, a floating node to temporarily store the charge carries, and a number of transistor gates (transfer gate, source follower, reset transistor, etc.) to convey the charge carriers out of the pixel to be further processed by a peripheral circuitry. An image sensor is often packaged with its supporting elements into an image sensor package, which is then incorporated into an imaging product such as a mobile phone camera, a consumer electronic camera, a surveillance video camera, an automotive driver assistance device, a medical imaging endoscope, etc.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
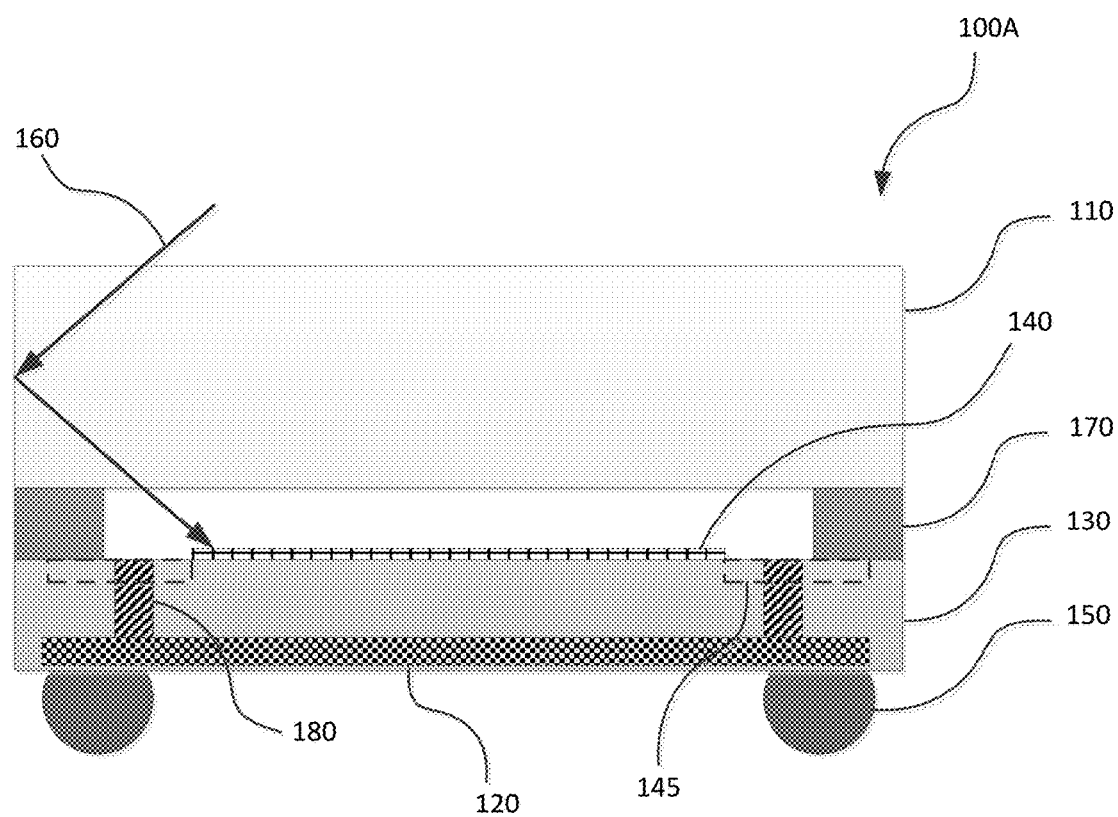
FIG. 1A is a cross sectional side view showing a first embodiment of an image sensor package with a redistribution layer and solder balls underneath a sensor pixel array.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "example" or "embodiment" means that a particular feature, structure, or characteristic described in connection with the example is included in at least one example of the present invention. Thus, the appearances of "example" or "embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

First Image Sensor Package Embodiment

FIG. 1A is a cross sectional side view showing a first embodiment of an image sensor package 100A. The first embodiment of sensor package 100A includes a silicon substrate 130, wherein an image sensor pixel array 140 is formed on its top or front side surface. The image sensor pixel array 140 includes a number of image sensor pixels; each pixel is configured to detect incoming photons and produce opto-electric signals in response. These pixels may be exemplarily based on Complementary Metal Oxide Semiconductor (CMOS) or Charge Coupled Device (CCD) designs. Surrounding the pixel array 140 is a peripheral circuit region 145, which is marked with dotted line rectangles in FIG. 1A. The electric signals produced by the pixel array 140 are conveyed into this peripheral circuit region 145 to be further processed. At the bottom or back side surface of the silicon substrate 130 is a redistribution layer (RDL) 120, which contains metal wiring. A through-silicon via (TSV) 180 connects to provide an electric coupling between the peripheral circuit region 145 at the silicon substrate's front side surface with the RDL 120 at the silicon substrate's back side surface. Solder balls 150 are connected (e.g., electrically coupled) to the RDL 120. When the solder balls 150 are mounted on a printed circuit board (PCB, not shown in FIG. 1A), electric coupling will be established between the RDL 120 and the PCB. Dams 170 are situated on the front side surface of the silicon substrate 130. A cover glass 110 is situated on top of the dams 170.

It is appreciated that in this first embodiment of image sensor package 100A, the RDL 120 and the solder balls 150 are situated directly underneath the image sensor pixel array 140. This configuration may cause the total height of the sensor package 100A to be relatively tall. This is a shortcoming of this first embodiment of image sensor package 100A. Another shortcoming is an edge flare issue. As shown in FIG. 1A, an incoming light ray 160 entering the sensor package 100A at an oblique angle may reflect off the side of the cover glass 110, and falls onto the edge of the pixel array 140. This will cause flaring (over-exposure) around the edges of an image that is produced by the pixel array 140, hence the term edge flare. This is an undesirable effect that needs to be eliminated.

Second Image Sensor Package Embodiment

Figure 1B:
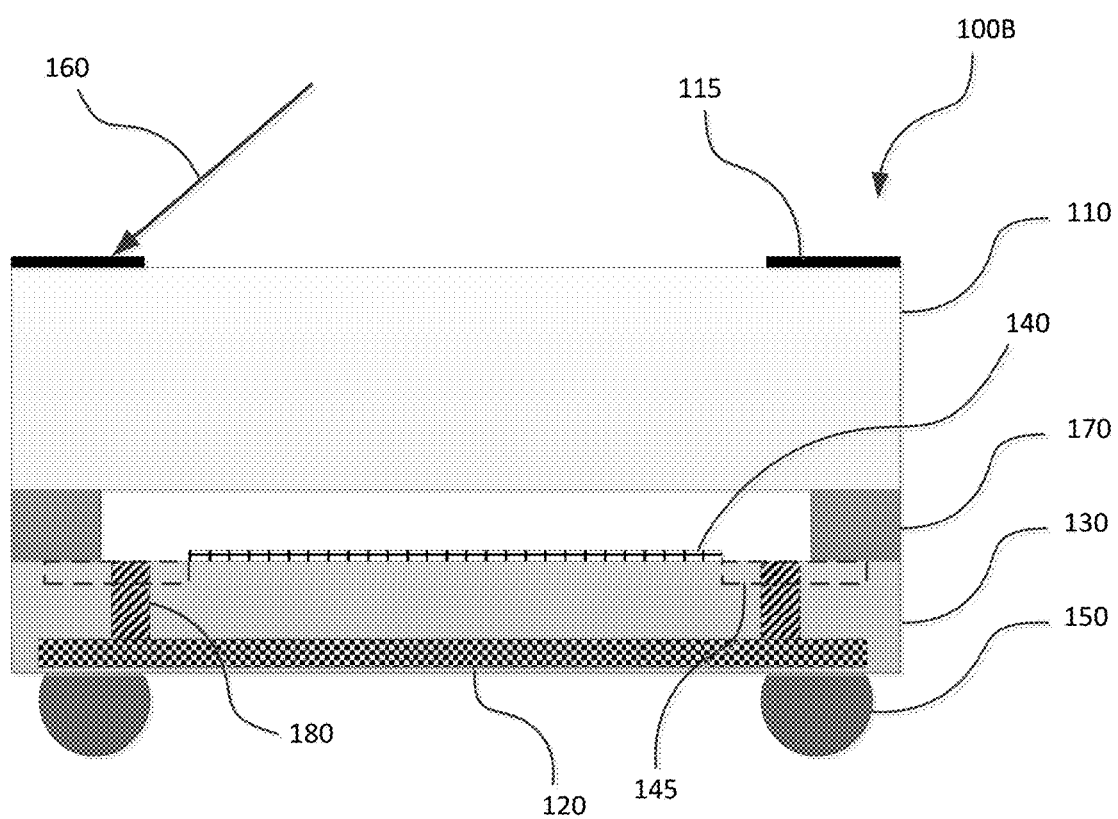
FIG. 1B is a cross sectional view showing a second embodiment of an image sensor package with a cover glass light shield to reduce edge flare.

To deal with the edge flare issue, an improved image sensor package is disclosed herein. FIG. 1B is a cross sectional view showing a second embodiment of image sensor package 100B, which has the same components as the first embodiment of image sensor package 100A, except that on the top surface of the cover glass 110, the second embodiment of sensor package 100B has a light shield 115 to block the incoming light ray 160. The light shield 115 may be made of a reflective material such as a metal, or an absorbent material such as a black photo-resist. As a result of this light shield blocking, the incoming light ray 160 will not be able to reflect off the side of the cover glass 110 as shown previously in FIG. 1A, thereby eliminating the edge flare.

Since the RDL 120 and the solder balls 150 are still situated directly underneath the image sensor pixel array 140, the total height of the second embodiment of sensor package 100B is still the same as the first embodiment of sensor package 100A. Hence the previously disclosed shortcoming of excessive sensor package height remains unsolved.

Third Image Sensor Package Embodiment

To deal with the image sensor package excessive height issue, the previously disclosed design of stacking the pixel array with the RDL and the solder balls is improved by a design of placing the RDL and the solder balls to the sides of the pixel array. This type of image sensor package design may be referred to as a fan-out package, in contrast to the previously disclosed stacked package design.

Figure 2A:
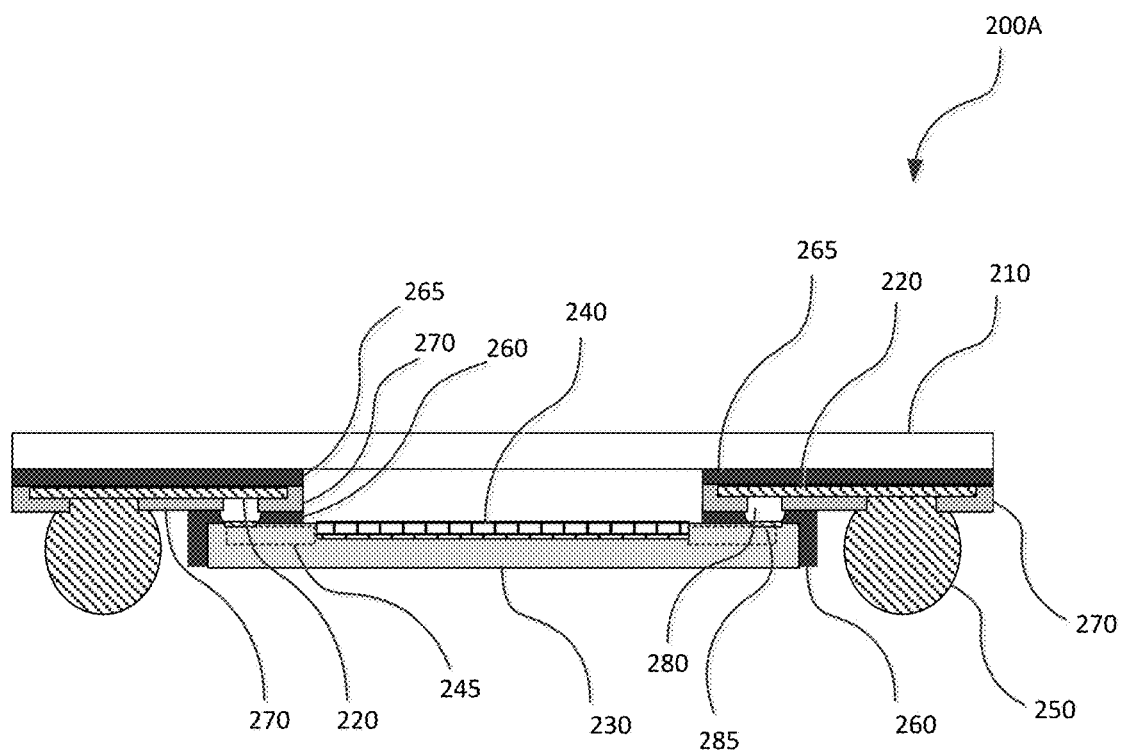
FIG. 2A is a cross sectional view showing a third embodiment of an image sensor package with redistribution layers and solder balls located to the sides of a sensor pixel array.

FIG. 2A is a cross sectional view showing an improved image sensor package design with RDL and solder balls located to the sides of a sensor pixel array. A third embodiment of image sensor package 200A includes a silicon substrate 230 that has a first surface (i.e., top or front side surface; not labeled) and a second surface (i.e., bottom or back side surface; not labeled), wherein an image sensor pixel array 240 is formed on the front side surface of the silicon substrate 230. The image sensor pixel array 240 includes a number of image sensor pixels; each pixel is configured to detect incoming photons and produce optoelectric signals accordingly. These pixels may be exemplarily based on CMOS or CCD designs. Surrounding the pixel array 240 is a peripheral circuit region 245 that is situated at the front side surface of the silicon substrate 230. The peripheral circuit region 245 is marked with dotted line rectangles in FIG. 2A. Electric signals produced by the pixel array 240 are conveyed into this peripheral circuit region 245 to be further processed.

One or several RDL 220 and solder balls 250 are situated to the sides of the pixel array 240. The solder balls 250 may also be referred to as ball grid array (BGA) 250, and are situated completely to the sides of the silicon substrate 230, as shown in FIG. 2A. The RDL 220 contains metal wiring, and is mechanically and electrically coupled to the solder balls 250. More specifically, the RDL 220 includes a first surface (i.e., top or front side surface; not labeled) and a second surface (i.e., bottom or back side surface; not labeled), wherein the RDL 220 is coupled to the solder balls 250 at the back side surface of the RDL 220. A cover glass 210 is coupled to the front side surface of the RDL 220, and is situated directly above the pixel array 240, as shown in FIG. 2A.

When the solder balls 250 are mounted on a printed circuit board (PCB; not shown), electric coupling will be established between the RDL 220 and the PCB through the solder balls 250. Crucially, one or several gold bumps 280 and gold bump contacts 285 establish electrical coupling between the RDL 220 and the peripheral circuit regions 245. As a result, an electrical connection is established between the PCB and the peripheral circuit regions 245 through the solder balls 250, the RDL 220, the gold bumps 280, and the gold bump contacts 285. The gold bumps 280 and their associated gold bump contacts 285 are so named because the bumps are often made of gold, which is a good conductor. However, other materials with similarly good conductivity may also be used to establish electrical coupling between the RDL 220 and the peripheral circuit regions 245.

One or a number of solder mask flux (SMF) 270, cover (CV) layer 265, and jetting glue 260 provide mechanical bonding and electrical insulation between the various parts of the image sensor package 200A. The SMF 270 is made of an insulating material (e.g., lacquer or certain polymers). It surrounds part of the gold bump 280, the RDL 220, and the solder balls 250, as shown in FIG. 2A, in order to provide electric insulation of these parts. Also, the jetting blue 260 may be made of an insulating material. It surrounds part of the gold bump 280 to provide electric insulation, and also bonds to the SMF 270 to provide a mechanical coupling to connect the silicon substrate 230 to the RDL 220 and the solder balls 250. Lastly, the CV layer 265 may be made of an insulating material. It binds to both a cover glass 210 and the RDL 220 to provide a mechanical coupling between these two parts.

The cover glass 210 is situated directly above the pixel array 240, with a gap in between. Due to the positioning of the CV layer 265, the SMF 270, and the jetting glue 260, as shown in FIG. 2A, these three parts function together as a dam in order to hold the cover glass 210 aloft and above the pixel array 240.

Importantly, the RDL 220 and the solder balls 250 are situated to the sides of the silicon substrate 230. It is appreciated that the solder balls 250 are completely to the sides of the silicon substrate 230. No part of the solder balls 250 overlaps above or under the silicon substrate 230, or the pixel array 240. It is also appreciated that no part of the RDL 220 overlaps above or under the pixel array 240. Such positional relationships help to reduce the overall height of the image sensor package 200A, in contrast to the image sensor packages 100A and 100B as previously shown in FIGS. 1A and 1B.

Fourth Image Sensor Package Embodiment

Figure 2B:
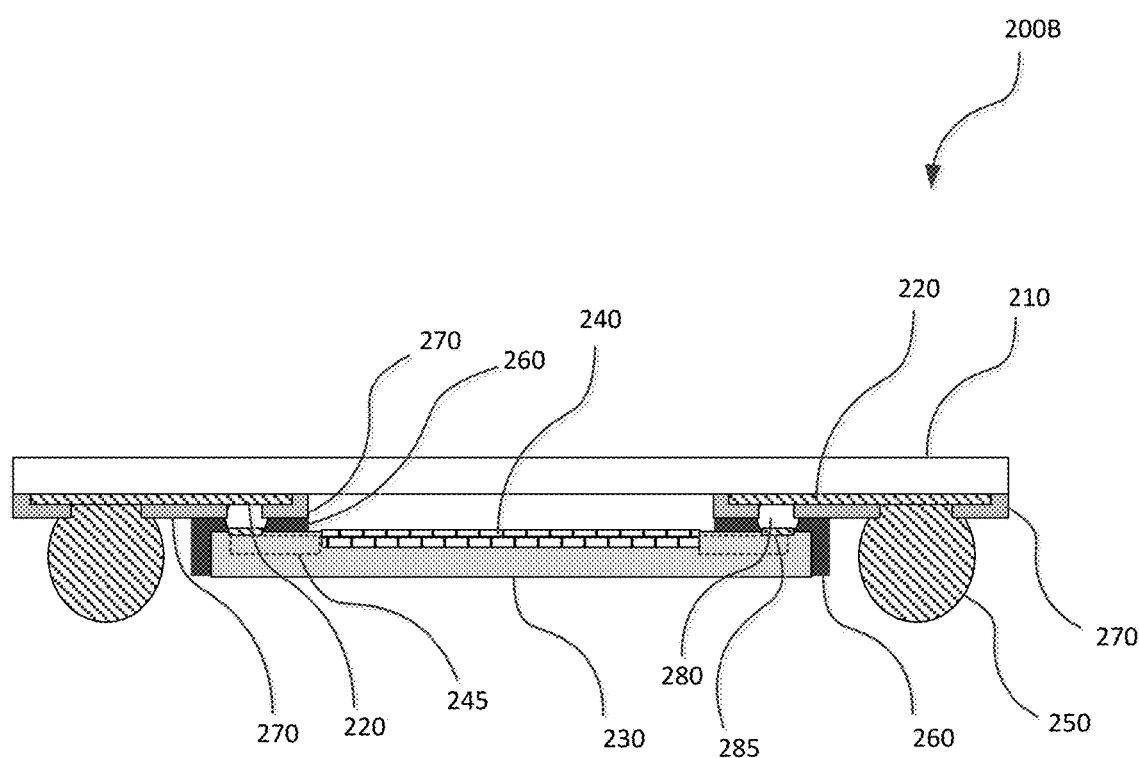
FIG. 2B is a cross sectional view showing a fourth embodiment of a reduced height image sensor package with redistribution layers and solder balls located to the sides of a sensor pixel array.

FIG. 2B is a cross sectional view showing a fourth embodiment of image sensor package 200B, which has the same components as the third embodiment of image sensor package 200A, except that the cover glass 210 is directly bonded to the RDL 220 and the SMF 270, without the use of the CV layer 265 as in the image sensor package 200A. There are non-metallic components within the RDL 220, and SMF 270 may be entirely non-metallic. These parts may be designed to possess adhesive properties to couple them directly to the cover glass 210. Compared with FIG. 2A, it is appreciated that only the SMF 270 and the jetting glue 260 now function as a dam to hold the cover glass 210 aloft and above the pixel array 240. The CV layer 265 in FIG. 2A is no longer used. This helps to further reduce the overall height of the image sensor package 200B, as compared with the image sensor package 200A in FIG. 2A.

Edge Flare Issues in Fan-Out Image Sensor Packages

Figure 3A:
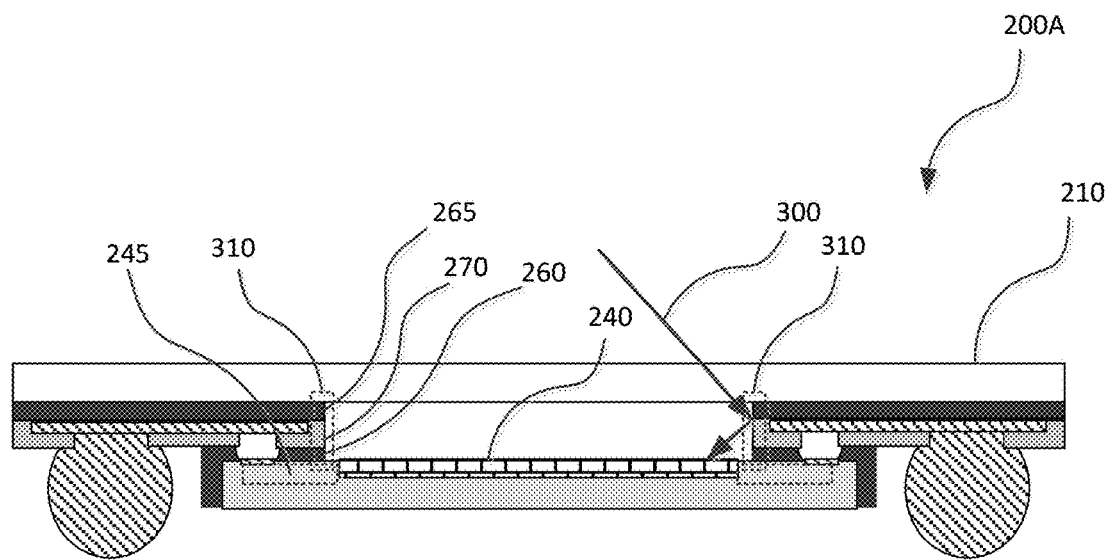
FIGS. 3A and 3B are cross sectional views showing an edge flare effect of the third embodiment and the fourth embodiment of an image sensor package, respectively.
Figure 3B:
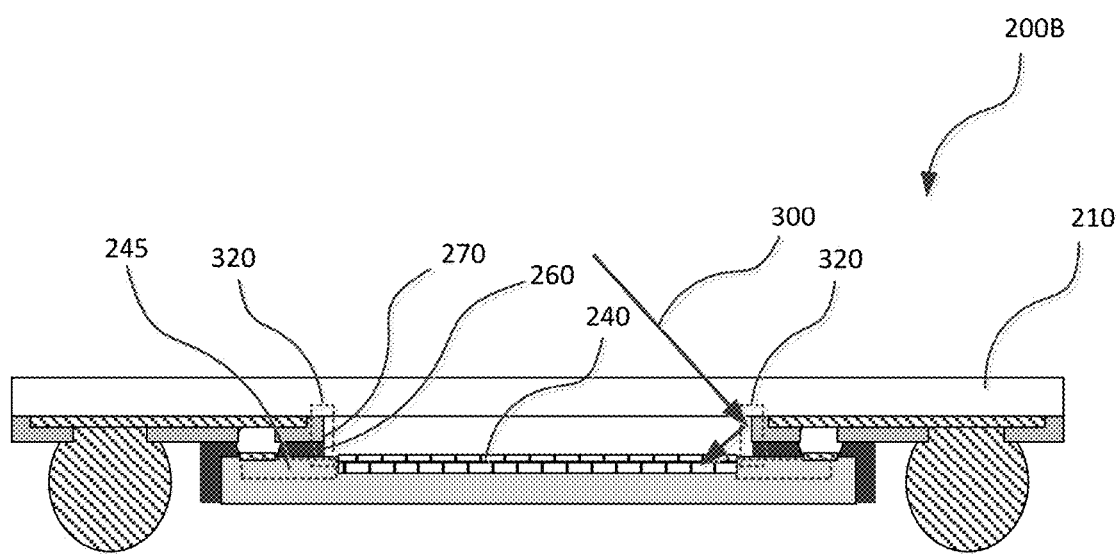

The fan-out image sensor packages (e.g., the third and fourth embodiments of image sensor packages 200A and 200B as previously disclosed in FIGS. 2A and 2B) suffer from potential edge flare problems. FIGS. 3A and 3B are cross sectional views showing an edge flare effect of the third embodiment and the fourth embodiment of image sensor packages 200A and 200B, respectively.

As shown in FIG. 3A, an incoming light ray 300 entering the third embodiment of image sensor package 200A at an oblique angle may reflect off a side wall 310 of a stacked structure consisting of the CV layer 265, the SMF 270, and the jetting glue 260. The light ray 300 is reflected, and falls on to the edge of the pixel array 240, as shown by the arrowed lines in FIG. 3A. This will cause a flaring around the edges of an image produced by the pixel array 240. This undesirable edge flare effect needs to be eliminated. It is appreciated that the distance between the side wall 310 and the edge of the pixel array 240 is a factor in this edge flaring phenomenon. A narrow distance (e.g., 75 micrometers or less) will increase the likelihood of the edge flare effect. Making this narrow distance wider (e.g., to 140 micrometers or above) will help to decrease or eliminate the edge flare effect. However, widening the distance will also increase the lateral size of the image sensor package 200A, and may be considered undesirable.

Similarly in FIG. 3B, an incoming light ray 300 entering the fourth embodiment of image sensor package 200B at an oblique angle may reflect off a side wall 320 consisting of a stacked structure of the SMF 270 and the jetting glue 260. The light ray 300 is reflected, and falls on to the edge of the pixel array 240, as shown by the arrowed lines in FIG. 39. This will also cause a flaring around the edges of an image produced by the pixel array 240. Similar to the situation of the image sensor package 200A, this edge flaring is more likely to occur when the distance between the side wall 320 and the edge of the pixel array 240 is 75 micrometers or less. Increasing this distance to 140 micrometers or above will decrease or eliminate the edge flaring, but will also undesirably increase the lateral size of the image sensor package 200B.

Fifth Image Sensor Package Embodiment

Figure 4A:
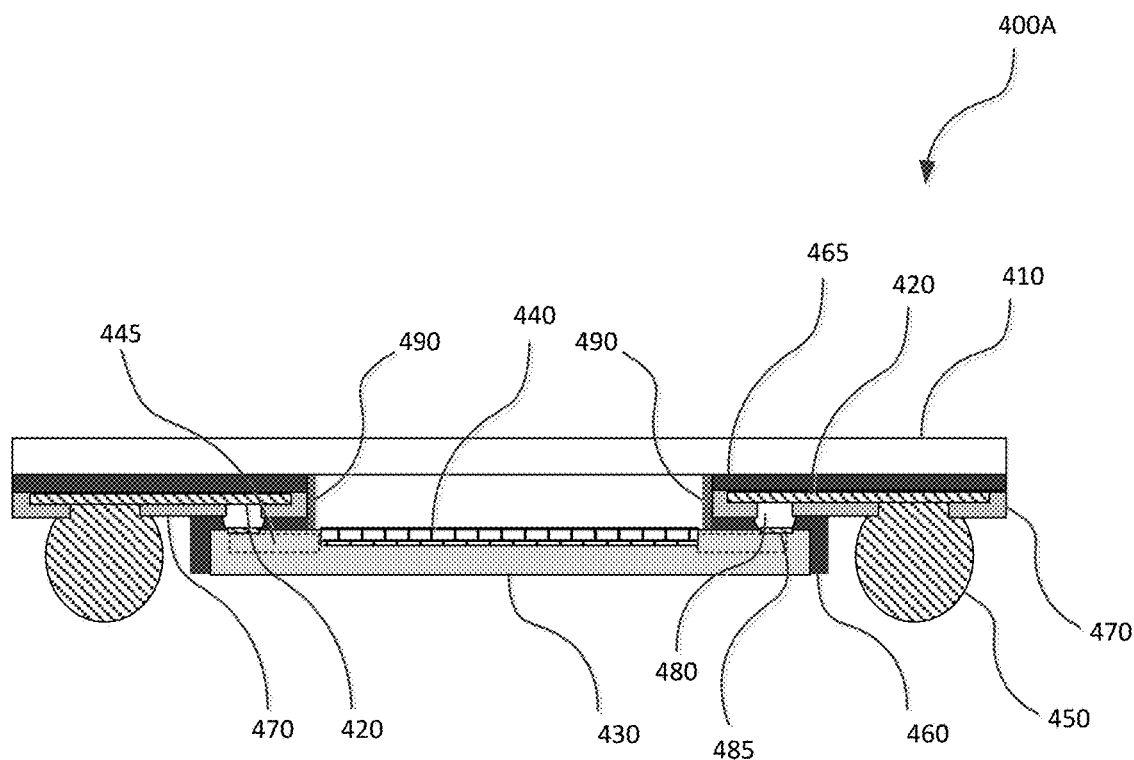
FIG. 4A is a cross sectional side view showing a fifth embodiment of an image sensor package with a dark material side wall that reduces the edge flare effect.

Improvements are made to the fan-out image sensor packages in order to deal with the edge flare issue. FIG. 4A is a cross sectional side view showing a fifth embodiment of image sensor package 400A, which has a dark material side wall 490 that reduces the edge flare effect. The fifth embodiment of image sensor package 400A is an improvement over the third embodiment of image sensor 200A as previously disclosed in FIG. 2A. The numbering of many parts in FIG. 4A is analogous to FIG. 2A. For example, a cover glass is numbered as 410 in FIG. 4A, and similarly as 210 in FIG. 2A. Similarly, FIG. 4A shows an RDL 420, a silicon substrate 430, a pixel array 440, a peripheral circuit region 445, solder balls 450, jetting glue 460, a CV layer 465, SMF 470, gold bumps 480, and gold bump contacts 485. Each of these parts relates to its corresponding counterpart in FIG. 2A, i.e., the RDL 220, the silicon substrate 230, the pixel array 240, the peripheral circuit region 245, the solder balls 250, the jetting glue 260, the CV layer 265, the SMF 270, the gold bumps 280, and the gold bump contacts 285, respectively. The aforementioned various parts in FIG. 4A have substantially the same relationship to each other, and perform substantially the same functions as their corresponding counterparts in FIG. 2A.

Importantly, the RDL 420 and the solder balls 450 are situated to the sides of the silicon substrate 430. It is appreciated that the solder balls 450 are completely to the sides of the silicon substrate 430. No part of the solder balls 450 overlaps above or under the silicon substrate 430 or the pixel array 440. It is also appreciated that no part of the RDL 420 overlaps above or under the pixel array 440. Such positional relationships help to reduce the overall height of the image sensor package 400A, in contrast to the image sensor packages 100A and 100B as previously shown in FIGS. 1A and 1B.

The cover glass 410 is situated directly above the pixel array 440, with a gap in between. Due to the positioning of the CV layer 465, the SMF 470, and the jetting glue 460, these three parts function together as a dam to hold the cover glass 410 aloft and above the pixel array 440. This spatial-functional relationship is the same as the one previously disclosed in FIGS. 2A and 3A. Significantly, the CV layer 465, the SMF 470, and the jetting glue 460 form a side wall that if left as is and without some type of covering or modification, will be prone to reflecting incoming light rays onto the edges of the pixel array 440. This side wall is not labeled in FIG. 4A, but can been viewed as part 310 in FIG. 3A.

As shown in FIG. 4A, a dark material layer 490 is applied to cover a portion of or all of this side wall. This dark material layer 490 functions in part to reduce or prevent the incoming light ray 300 (see FIG. 3A) from reflecting off it to fall on to the edges of the pixel array 440. As a result, edge flare will be reduced or eliminated.

The dark material layer 490 may be made of an organic black material, e.g., a black photo-resist (a type of polymer or resin). It may also be a metallic substance that has a low reflective surface. In an embodiment, the dark material layer has a reflectivity of 1% or less. In another embodiment, the dark material layer 490 has sufficient thickness in order to possess such a low reflectivity value.

Sixth Image Sensor Package Embodiment

Figure 4B:
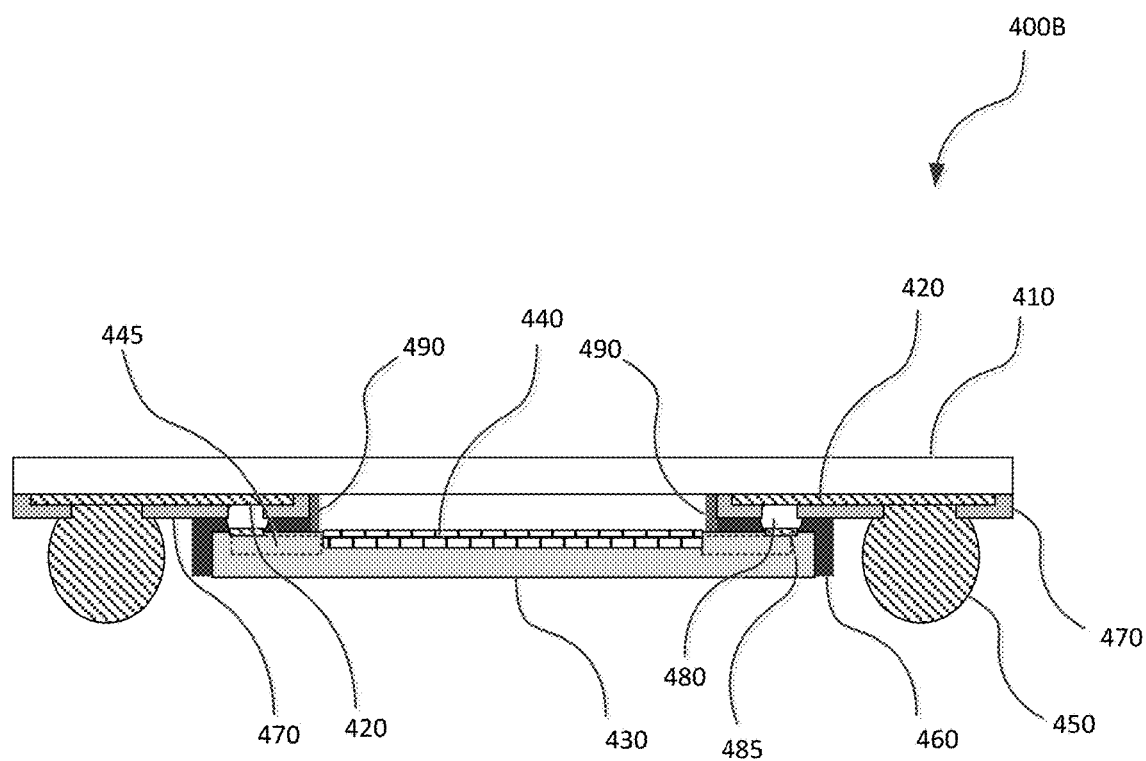
FIG. 4B is a cross sectional side view showing a sixth embodiment of an image sensor package with a dark material side wall that reduces the edge flare effect.

FIG. 4B is a cross sectional side view showing a sixth embodiment of image sensor package 400B, which has a dark material side wall 490 that reduces the edge flare effect. The sixth embodiment of image sensor package 400B is an improvement over the fourth embodiment of image sensor 200B as previously disclosed in FIG. 2B. The sixth embodiment of image sensor package 400B has the same components as the fifth embodiment of image sensor package 400A, except that the cover glass 410 is directly bonded to the RDL 420 and the SMF 470, without the use of the CV layer 465 as in the image sensor package 400A. There are non-metallic components within the RDL 420. The SMF 470 may be entirely non-metallic. These two parts may be designed to possess sufficient adhesive properties in order to couple them directly to the cover glass 410. Compared with the image sensor package 400A in FIG. 4A, it is appreciated that, in the image sensor package 400B, only the SMF 470 and the jetting glue 460 now function together as a dam to hold the cover glass 410 aloft and above the pixel array 440. The CV layer 465 as shown in FIG. 4A is no longer used. This helps to further reduce the overall height of the image sensor package 400B, as compared with the image sensor package 400A in FIG. 4A.

As previously mentioned, due to the positioning of the SMF 470 and the jetting glue 460, these two parts function as a dam to hold the cover glass 410 aloft and above the pixel array 440. This spatial-functional relationship is the same as the one previously disclosed in FIGS. 2B and 3B. Significantly, the SMF 470 and the jetting glue 460 form a side wall that, if left as is and without some type of covering or modification, will be prone to reflecting incoming light rays onto the edges of the pixel array 440. This side wall is not labeled in FIG. 4B, but can been viewed as part 320 in FIG. 3B.

As shown in FIG. 4B, a dark material layer 490 is applied to cover a portion of or all of this side wall. This dark material layer 490 functions in part to reduce or prevent the incoming light ray 300 (see FIG. 3B) from reflecting off it, and fall on to the edges of the pixel array 440. As a result, edge flare will be reduced or eliminated.

The dark material layer 490 may be made of an organic black material t, e.g., a black photo-resist. It may also be a metallic substance that has a low reflective surface. In an embodiment, the dark material layer has a reflectivity of 1% or less. In another embodiment, the dark material layer 490 has sufficient thickness in order to possess such a low reflectivity value.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor package, comprising:
   (a) a silicon substrate that includes a first substrate surface, and a second substrate surface that is opposite to the first substrate surface;
   (b) an image sensor pixel array that is formed on the silicon substrate, and is positioned at the first substrate surface;
   (c) a peripheral circuit region that is formed around the image sensor pixel array on the silicon substrate, and is positioned at the first substrate surface;
   (d) a redistribution layer (RDL) that is electrically coupled to the peripheral circuit region;
   (e) at least one solder ball that is electrically coupled to the RDL, wherein the solder ball is situated to sides of the silicon substrate, no parts of the solder ball overlaps above the silicon substrate and no parts of the solder ball overlaps under the silicon substrate; and
   (f) a cover glass that is directly bonded to the RDL, wherein the cover glass is located directly above the image sensor pixel array and wherein the RDL is situated to sides of the image sensor pixel array;
   (g) an insulation material layer that is bonded to the RDL;
   (h) an adhesive layer that causes the RDL to adhere to the silicon substrate; wherein the adhesive layer is bonded to the insulation material layer, and to the first substrate surface of the silicon substrate;
   wherein the RDL includes a first RDL surface and a second RDL surface that is opposite to the first RDL surface; wherein the first RDL surface faces the same direction as the first substrate surface; and wherein the second RDL surface faces the same direction as the second substrate surface.

2. The image sensor package of claim 1, wherein the at least one solder ball is electrically coupled to the second RDL surface.

3. The image sensor package of claim 2, wherein the RDL is electrically coupled to the peripheral circuit region through a metallic member.

4. The image sensor package of claim 2, wherein no part of the RDL is located directly above the image sensor pixel array, and wherein no part of the RDL is located directly below the image sensor pixel array.

5. The image sensor package of claim 1, wherein the insulation material layer and the adhesive layer form a dam that is positioned on the first substrate surface, and is located to all sides of the image sensor pixel array; and wherein the dam has a side wall that faces towards the image sensor pixel array.

6. The image sensor package of claim 5, further including a dark material layer that covers at least a part of the side wall of the dam.

7. The image sensor package of claim 6, wherein the dark material layer comprises a black polymer material.

8. The image sensor package of claim 6, wherein the dark material layer has a reflectivity of at most one percent.

9. An image sensor package, comprising:
   (a) a silicon substrate that includes a first substrate surface, and a second substrate surface that is opposite to the first substrate surface;
   (b) an image sensor pixel array that is formed on the silicon substrate, and is positioned at the first substrate surface;
   (c) a peripheral circuit region that is formed around the image sensor pixel array on the silicon substrate, and is positioned at the first substrate surface;
   (d) a redistribution layer (RDL) that is electrically coupled to the peripheral circuit region;
   (e) at least one solder ball that is electrically coupled to the RDL, wherein the solder ball is situated to sides of the silicon substrate, no parts of the solder ball overlaps above the silicon substrate and no parts of the solder ball overlaps under the silicon substrate; and
   (f) a cover glass that is coupled to the RDL and wherein the RDL is situated to sides of the image sensor pixel array;
   (g) an insulation material layer that is bonded to the RDL;
   (h) an adhesive layer that causes the RDL to adhere to the silicon substrate; wherein the adhesive layer is bonded to the insulation material layer, and to the first substrate surface of the silicon substrate;
   wherein the RDL includes a first RDL surface and a second RDL surface that is opposite to the first RDL surface; wherein the first RDL surface faces the same direction as the first substrate surface; and wherein the second RDL surface faces the same direction as the second substrate surface;
   further including a cover layer that is bonded to the first RDL surface of the RDL and the cover glass.

10. The image sensor package of claim 9, wherein the cover layer, the insulation material layer, and the adhesive layer form a dam that is positioned on the first substrate surface, and is located to all sides of the image sensor pixel array; and wherein the dam has a side wall that faces towards the image sensor pixel array.

11. The image sensor package of claim 10, further including a dark material layer that covers at least a part of the side wall of the dam.

12. An image sensor system comprising an image sensor package, wherein the image sensor package includes:
(a) a silicon substrate that includes a first substrate surface, and a second substrate surface that is opposite to the first substrate surface;
(b) an image sensor pixel array that is formed on the silicon substrate, and is positioned at the first substrate surface;
(c) a peripheral circuit region that is formed around the image sensor pixel array on the silicon substrate, and is positioned at the first substrate surface;
(d) a redistribution layer (RDL) that is electrically coupled to the peripheral circuit region;
(e) at least one solder ball that is electrically coupled to the RDL, wherein the solder ball is situated to sides of the silicon substrate, no parts of the solder ball overlaps above the silicon substrate and no parts of the solder ball overlaps under the silicon substrate; and
(f) a cover glass that is directly bonded to the RDL, wherein the cover glass is located directly above the image sensor pixel array and wherein the RDL is situated to sides of the image sensor pixel array;
(g) an insulation material layer that is bonded to the RDL;
(h) an adhesive layer that causes the RDL to adhere to the silicon substrate; wherein the adhesive layer is bonded to the insulation material layer, and to the first substrate surface of the silicon substrate;
wherein the RDL includes a first RDL surface and a second RDL surface; wherein the first RDL surface faces the same direction as the first substrate surface; and wherein the second RDL surface faces the same direction as the second substrate surface.

13. The image sensor system of claim 12, wherein the at least one solder ball is electrically coupled to the second RDL surface.

14. The image sensor system of claim 13, wherein
no part of the RDL is located directly above the image sensor pixel array; and
no part of the RDL is located directly below the image sensor pixel array.

15. The image sensor system of claim 14, wherein the insulation material layer and the adhesive layer form a dam that is positioned on the first substrate surface, and is located to all sides of the image sensor pixel array; and
wherein the dam has a side wall that faces towards the image sensor pixel array.

16. The image sensor system of claim 15, further including a dark material layer that covers at least a part of the side wall of the dam.

* * * * *